(12) United States Patent
Zhang

(10) Patent No.: US 12,550,593 B2
(45) Date of Patent: Feb. 10, 2026

(54) DISPLAY PANEL INCLUDING TIGHTENING STRUCTURE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventor: Yang Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 791 days.

(21) Appl. No.: 17/758,023

(22) PCT Filed: May 19, 2022

(86) PCT No.: PCT/CN2022/093877
§ 371 (c)(1),
(2) Date: Jun. 26, 2022

(87) PCT Pub. No.: WO2023/201823
PCT Pub. Date: Oct. 26, 2023

(65) Prior Publication Data
US 2024/0172534 A1    May 23, 2024

(30) Foreign Application Priority Data
Apr. 21, 2022   (CN) .......................... 202210423570.6

(51) Int. Cl.
*H10K 59/80*     (2023.01)
(52) U.S. Cl.
CPC ............................ *H10K 59/8731* (2023.02)

(58) Field of Classification Search
CPC .................................................. H10K 59/8731
See application file for complete search history.

(56) References Cited

U.S. PATENT DOCUMENTS

2011/0039097 A1* 2/2011 Murashige ........... H10K 77/111
428/441
2016/0079564 A1   3/2016 Shim et al.
(Continued)

FOREIGN PATENT DOCUMENTS

CN         106328826 A     1/2017
CN         108539041 A     9/2018
(Continued)

OTHER PUBLICATIONS

Machine translation of CN-110518145-A, retrieved from worldwide.espacenet.com on Aug. 15, 2025 (Year: 2025).*
(Continued)

*Primary Examiner* — Abdulmajeed Aziz
*Assistant Examiner* — Steven Y Horikoshi
(74) *Attorney, Agent, or Firm* — PV IP PC; Peter S. Stecher; Wei Te Chung

(57) ABSTRACT

A display panel and a mobile terminal are disclosed. The display panel comprises a substrate, a display function layer disposed on the substrate, a first blocking structure surrounding the display function layer, the first blocking structure comprising a transition area, a first inorganic layer at least covering the first blocking structure and the display function layer, an organic layer at least covering the display function layer and the first blocking structure, and a second inorganic layer covering the organic layer; wherein a tightening structure is disposed between the organic layer and the second inorganic layer in the transition area.

16 Claims, 7 Drawing Sheets

(56) References Cited

U.S. PATENT DOCUMENTS

| | | | |
|---|---|---|---|
| 2018/0047940 A1* | 2/2018 | Sonoda | H10K 77/111 |
| 2020/0006714 A1* | 1/2020 | Zhang | H10K 59/8722 |
| 2020/0313117 A1* | 10/2020 | Xu | H10K 59/8731 |
| 2021/0134901 A1* | 5/2021 | Sung | H10K 59/121 |
| 2021/0328158 A1* | 10/2021 | Kang | H10K 77/111 |
| 2022/0158130 A1* | 5/2022 | Hwang | H10K 50/844 |
| 2022/0310739 A1* | 9/2022 | Wei | H10K 59/131 |

FOREIGN PATENT DOCUMENTS

| | | | | |
|---|---|---|---|---|
| CN | 108777266 A | | 11/2018 | |
| CN | 109273507 A | | 1/2019 | |
| CN | 109309176 A | | 2/2019 | |
| CN | 109545758 A | | 3/2019 | |
| CN | 110299470 A | | 10/2019 | |
| CN | 110335966 A | | 10/2019 | |
| CN | 110518145 A | * | 11/2019 | H10K 71/00 |
| CN | 110828691 A | | 2/2020 | |
| CN | 111106262 A | | 5/2020 | |
| CN | 111834543 A | * | 10/2020 | G09F 9/301 |
| CN | 113838998 A | | 12/2021 | |
| CN | 113937137 A | | 1/2022 | |
| CN | 111081736 B | * | 7/2022 | H10K 50/8426 |
| WO | 2019214285 A1 | | 11/2019 | |

OTHER PUBLICATIONS

International Search Report in International application No. PCT/CN2022/093877, mailed on Nov. 25, 2022.

Written Opinion of the International Search Authority in International application No. PCT/CN2022/093877, mailed on Nov. 25, 2022.

Chinese Office Action issued in corresponding Chinese Patent Application No. 202210423570.6 dated Dec. 22, 2022, pp. 1-8.

\* cited by examiner

DISPLAY PANEL INCLUDING TIGHTENING STRUCTURE AND MOBILE TERMINAL

FIELD OF INVENTION

The present application relates to the field of display, and in particular to a display panel and a mobile terminal.

BACKGROUND OF DISCLOSURE

In the modern communication industry, the market demand for mobile phones, TVs, tablets, notebooks, digital cameras and other products is increasing, and various folding screens and curved screens have appeared in the market one after another. However, if the screens require better bending performance, it is necessary to improve the screen body. Since currently most curved screens are outward-folding products, and the inorganic layer thereof is more prone to form cracks or gaps when bending compared to the organic layer. Inorganic layers, such as the encapsulation layers and the touch layer, are placed just above a neutral layer, therefore most curved screens will be added a compressive stress layer on the encapsulation layer and touch layer to improve the screen's bending performance.

However, the addition of the compressive stress layer will cause interlayer cracks to occur in the organic layer and the inorganic layer on the area where the blocking structure used for encapsulation at the edge of the display panel is located.

SUMMARY OF INVENTION

Technical Problem

Embodiments of the present application provide a display panel and a mobile terminal, which can effectively increase the adhesion between layers of the display panel and prevent interlayer cracking in the layers on the transition area of the blocking structure used for encapsulation at the edge of the display panel due to the addition of the compressive stress layer, for solving the technical problem that interlayer cracks are prone to occur in the organic layer and the inorganic layer on the area where the blocking structure used for packaging at the edge of the display panel is located after adding a compressive stress layer to the film layers of the touch layer to improve the bending performance of the screen.

Technical Solutions

In order to solve the above-mentioned problems, the technical solutions provided by the present application are as follows:

The embodiments of the present application provide a display panel, comprising:
- a substrate, wherein the substrate comprises a display area and a non-display area surrounding the display area;
- a display function layer, wherein the display function layer is disposed on the substrate in the display area;
- a first blocking structure, wherein the first blocking structure is disposed on the substrate in the non-display area, and the first blocking structure is disposed surrounding the display area, the first blocking structure comprises a top surface parallel to the substrate and a transition surface connecting the top surface and the substrate, the first blocking structure comprises a transition area, and the transition surface is located in the transition area;
- a first inorganic layer, wherein the first inorganic layer is disposed on the substrate, the first blocking structure and the display function layer;
- an organic layer, wherein the organic layer is disposed on the first inorganic layer, and covers the display function layer, the first blocking structure and part of the first inorganic layer; and
- a second inorganic layer, wherein the second inorganic layer is disposed on the organic layer, and covers the display function layer, the first blocking structure and the organic layer;
- wherein a tightening structure is disposed between the organic layer and the second inorganic layer, and the tightening structure is at least located in the transition area.

Optionally, the tightening structure comprises at least one recess disposed on the organic layer, the second inorganic layer faces toward a side of the organic layer and is provided with a plurality of protrusions at a position corresponding to the recess, and the protrusions are matched with the recess.

Optionally, the at least one recess comprises a plurality of grooves, the second inorganic layer faces toward a side of the organic layer and a plurality of protruding strips are disposed at positions corresponding to the grooves, and the protruding strips are disposed in the grooves.

Optionally, the grooves are disposed surrounding the first blocking structure.

Optionally, the at least one recess comprises a plurality of fixing holes disposed at intervals, the second inorganic layer faces toward a side of the organic layer and is provided with a fixing column disposed at positions corresponding to the fixing holes, and the fixing columns are disposed in the fixing holes.

Optionally, the at least one recess comprises a plurality of fastening structure groups, one of the fastening structure groups comprises a plurality of recesses, and the fastening structure groups are disposed in sequence along a direction from the display area to the non-display area;
wherein, among any two of the fastening structure groups, a distribution density of the recesses in one of the fastening structure groups close to the top surface or the substrate is greater than a distribution density of the recesses in the other one of the fastening structure groups away from the top surface or the substrate.

Optionally, a depth direction of the recesses is perpendicular to the substrate.

Optionally, the tightening structure comprises an adhesive layer, the adhesive layer at least covers the organic film in the transition area, and a material of the adhesive layer comprises hydrogen-doped amorphous silicon.

Optionally, the display panel comprises a second blocking structure, the second blocking structure is located at a side of the first blocking structure away from the display area, the second blocking structure is disposed surrounding the first blocking structure, and the organic layer is located in a region surrounded by the second blocking structure.

Optionally, a material of the first inorganic layer and the second inorganic layer comprises silicon nitride, silicon oxide, and aluminum oxide and a material of the organic layer comprises acrylate.

The embodiments of the present application further provide a mobile terminal, wherein the mobile terminal comprises a display panel and a terminal body, and the terminal body and the display panel are assembled together, wherein the display panel comprises:
- a substrate, wherein the substrate comprises a display area and a non-display area surrounding the display area;

a display function layer, wherein the display function layer is disposed on the substrate in the display area;

a first blocking structure, wherein the first blocking structure is disposed on the substrate in the non-display area, and the first blocking structure is disposed surrounding the display area, the first blocking structure comprises a top surface parallel to the substrate and a transition surface connecting the top surface and the substrate, the first blocking structure comprises a transition area, and the transition surface is located in the transition area;

a first inorganic layer, wherein the first inorganic layer is disposed on the substrate, the first blocking structure and the display function layer;

an organic layer, wherein the organic layer is disposed on the first inorganic layer, and covers the display function layer, the first blocking structure and part of the first inorganic layer; and a second inorganic layer, wherein the second inorganic layer is disposed on the organic layer, and covers the display function layer, the first blocking structure and the organic layer;

wherein a tightening structure is disposed between the organic layer and the second inorganic layer, and the tightening structure is at least located in the transition area.

Optionally, the tightening structure comprises at least one recess disposed on the organic layer, the second inorganic layer faces toward a side of the organic layer and is provided with a plurality of protrusion at a position corresponding to the recess, and the protrusions are matched with the recess.

Optionally, the at least one recess comprises a plurality of grooves, the second inorganic layer faces toward a side of the organic layer and is provided with a plurality of protruding strips at positions corresponding to the grooves, and the protruding strips are disposed in the grooves.

Optionally, the groove is disposed surrounding the first blocking structure.

Optionally, the at least one recess comprises a plurality of fixing holes disposed at intervals, the second inorganic layer faces toward a side of the organic layer and is provided with a fixing column at positions corresponding to the fixing holes, and the fixing columns are disposed in the fixing holes.

Optionally, the at least one recess comprises a plurality of fastening structure groups, one of the fastening structure groups comprises a plurality of recesses, and the fastening structure groups are disposed in sequence along a direction from the display area to the non-display area;

wherein, among any two of the fastening structure groups, a distribution density of the recesses in one of the fastening structure groups close to the top surface or the substrate is greater than a distribution density of the recesses in the other one of the fastening structure groups away from the top surface or the substrate.

Optionally, a depth direction of the recesses is perpendicular to the substrate.

Optionally, the tightening structure comprises an adhesive layer, the adhesive layer at least covers the organic film in the transition area, and a material of the adhesive layer comprises hydrogen-doped amorphous silicon.

Optionally, the display panel comprises a second blocking structure, the second blocking structure is located at a side of the first blocking structure away from the display area, the second blocking structure is disposed surrounding the first blocking structure, and the organic layer is located in a region surrounded by the second blocking structure.

Optionally, a material of the first inorganic layer and the second inorganic layer comprises silicon nitride, silicon oxide, and aluminum oxide and a material of the organic layer comprises acrylate.

Beneficial Effect

A tightening structure is disposed between the organic layer and the second inorganic layer of the display panel encapsulation structure, and the tightening structure is at least located in the transition area of the first blocking structure, the transition is formed by the tightening structure. Therefore, the organic layer and the second inorganic layer in the transition area are adhered more tightly, so as to prevent cracking between the organic layer and the second inorganic layer on the first blocking structure due to the addition of compressive stress layer.

DETAILED DESCRIPTION OF PREFERRED EMBODIMENTS

A display panel and a mobile terminal are provided. In order to clearly and completely describe the objectives, technical solutions and effects of the present application, the present application will be further described in detail below with reference to the accompanying drawings and examples. It should be understood that the specific embodiments described herein are only used to explain the present application, but not to limit the present application.

Embodiments of the present application provide a display panel and a mobile terminal. Each of them will be described in detail below. It should be noted that the description order of the following embodiments is not intended to limit the preferred order of the embodiments.

The present application provides the following embodiments, with specific reference to FIGS. 1 to 9.

Figure 1:
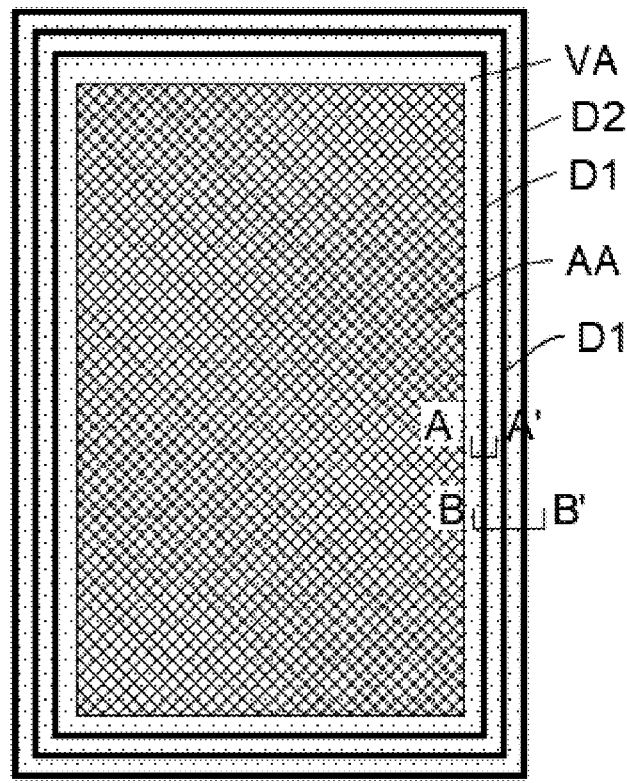
FIG. 1 is a schematic structural diagram of a display panel provided by an embodiment of the present application.
Figure 2:
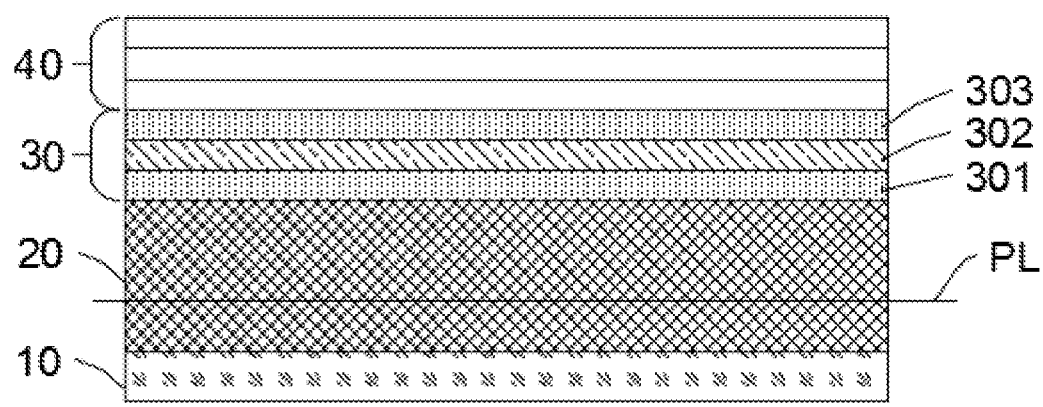
FIG. 2 is a schematic diagram of a layer structure of a display area of a display panel provided by an embodiment of the present application.
Figure 3:
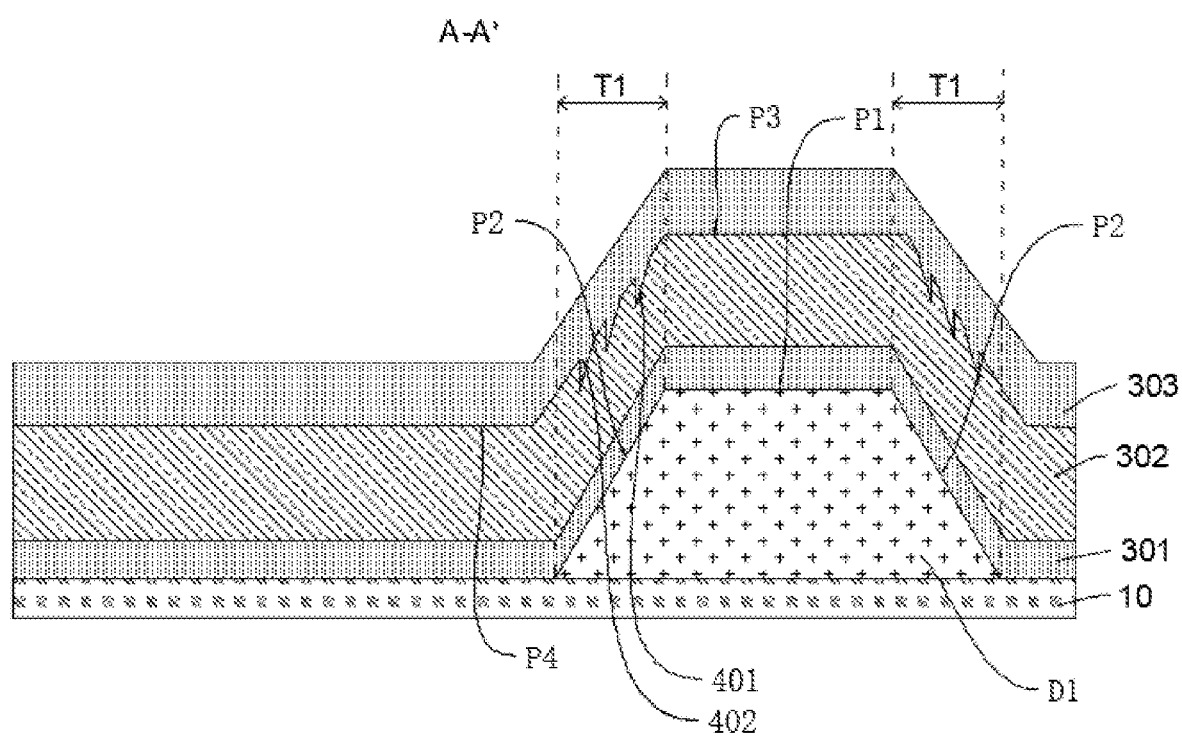
FIG. 3 is a partial cross-sectional structure schematic diagram of A-A' in FIG. 1.

As shown in FIGS. 1 to 3, an embodiment of the present application provides a display panel, the display panel comprises:

a substrate 10, wherein the substrate 10 comprises a display area AA and a non-display area VA surrounding the display area AA;

a display function layer 20, wherein the display function layer 20 is disposed on the substrate 10 in the display area AA;

a first blocking structure D1, wherein the first blocking structure D1 is disposed on the substrate 10 of the non-display area VA, and the first blocking structure D1 is disposed surrounding the display area AA, the first blocking structure D1 comprises a top surface P1 parallel to the substrate 10 and a transition surface P2 connecting the top surface P1 and the substrate 10, the first blocking structure D1 comprises a transition area T1, and the transition surface P2 is located in the transition area T1;

a first inorganic layer 301, wherein the first inorganic layer 301 is disposed on the substrate 10, the first blocking structure D1 and the display function layer 20;

an organic layer 302, wherein the organic layer 302 is disposed on the first inorganic layer 301 and covers the display function layer 20, the first blocking structure D1 and part of the first inorganic layer 301; and a second inorganic layer 303, wherein the second inorganic layer 303 is disposed on the organic layer 302, and covers the display function layer 20, the first blocking structure D1 and the organic layer 302;

wherein a tightening structure is disposed between the organic layer 302 and the second inorganic layer 303, and the tightening structure is at least located in the transition area T1.

In particular, the display panel comprises an OLED display panel or an LED display panel, which may be selected according to actual production conditions.

It should be noted that the display panel of the present application comprises a screen flexible curved display panel. Currently, the sides of the flexible display panel need to be bent, and the bending mode is generally outward bending.

As shown in FIG. 2, the display panel comprises a substrate, a display function layer 20 disposed on the substrate, an encapsulation layer 30 disposed on the display function layer 20, and a touch layer 40 disposed on the encapsulation layer 30, wherein the encapsulation layer 30 comprises an organic layer 302 and an inorganic layer which are stacked, the inorganic layer is easier to break than the organic layer when bending, and the inorganic layers such as the encapsulation layer 30 and the touch layer 40 are disposed above the neutral layer PL. Therefore, most of the curved screens will add a compressive stress layer (not shown in the drawing) on the layers of the encapsulation layer 30 and the touch layer 40, so that the inorganic layer moves up to a position of the neutral layer PL, so as to improves the bending performance of the screen and reduces the bending stress on the inorganic layer.

However, after the compressive stress layer is provided, the encapsulation area of the display panel, especially the part of the blocking structure, is prone to split between the organic layer and the inorganic layer, resulting in a gap between the layers. Therefore, an adhesion property between the inorganic layer and the organic layers 302 needs to be improved.

In particular, the substrate 10 comprises a flexible substrate, which may be polyimide.

In particular, the display functional layer 20 comprises, but is not limited to, a miniLED panel, an OLED panel or an LCD panel, which can be selected according to actual production conditions, and the panel structures capable of image display are all within the protection scope of the present application.

In particular, the first blocking structure D1 is used to improve the sealing performance of the encapsulation layer 30, the first blocking structure D1 is disposed in the non-display area VA and is disposed surrounding the display area AA, and the first blocking structure D1 may be a continuous annular structure, or a discontinuous intermittent structure surrounding the display area AA. In this embodiment, the first blocking structure D1 is a continuous annular structure for illustration.

In particular, there may be a plurality of the first blocking structures D1, and the plurality of first blocking structures D1 are disposed in sequence along a direction from the display area AA to the non-display area VA. As shown in FIG. 1, there are two first blocking structures D1. The two first blocking structures D1 are disposed in turn along a direction from the display area AA to the non-display area VA. By disposing the first blocking structure D1 and then disposing the encapsulation layer 30, the encapsulation effect of the encapsulation layer 30 in blocking water vapor can be improved, and the display device inside the display panel can be effectively prevented from being corroded.

In particular, a cross section of the first blocking structure D1 may be a trapezoid, an irregular fan shape, or a polygonal shape, and all structures that can play a blocking role are within the protection scope of the present application.

In particular, in this embodiment, the first blocking structure D1 is a trapezoid as an example, the first blocking structure D1 comprises a top surface P1, the top surface P1 may be parallel to the substrate 10, and an inclined surface between the top surface P1 and the substrates 10 is a transition surface P2, and an area where the transition surface P2 is located is the transition area T1. Generally, cracks in the layers between the organic layer 302 and the second inorganic layer 303 usually occur in the transition area T1. This area is an interface where the compressive stress layer interacts with the bending stress.

In particular, in a specific example, a stacked structure of the first inorganic layer 301, the organic layer 302 and the second inorganic layer 303 may be the thin film encapsulation layer 30. In another specific example, the second inorganic layers 303 may also comprise an inorganic layer and a touch control layer 40 in part of the encapsulation layers, wherein the touch control layer 40 is also a structure in which multiple layers of inorganic films are stacked.

In particular, a material of the first inorganic layer 301 and the second inorganic layer 303 comprises, but is not limited to, silicon nitride, silicon oxide, aluminum oxide, and the like.

In particular, a material of the organic layer 302 comprises, but is not limited to, acrylate.

In particular, the thickness of the first inorganic layer 301 may be 1-1.5 and the specific film thickness is not limited.

In particular, the thickness of the organic layer 302 can be adjusted according to actual production conditions, and the specific thickness is not limited.

In particular, a fastening structure is provided between the organic layer 302 and the second inorganic layer 303, and the fastening structure is used to adhere the organic layer 302 and the second inorganic layer 303 more tightly, so as to improve the adhesion performance between the layers, to prevent the occurrence of interlayer splitting between the inorganic layer and the organic layer 302 in the transition area T1 of the first blocking structure D1 due to the setting of the compressive stress layer which may result in a gap and affect the packaging effect.

In particular, the fastening structure comprises a physical fastening structure, for example, an interlocking structure may be provided on the organic layer 302 or the second inorganic layer 303, including but not limited to the structure of the grooves 4011 and the protruding strips matching each other. Otherwise, the surface of the layer is set to be wavy, so as to increase the contact area, thereby improving the adhesion performance between the second inorganic layer 303 and the organic layer 302.

In particular, the fastening structure may also comprise a chemical fastening structure, which may be one or more adhesive layers 403 with better adhesion performance. The material of the adhesive layer 403 has good adhesion to better the organic layer 302 and the second inorganic layer 303, and the material can be hydrogen-doped amorphous silicon.

In particular, the fastening structure is at least disposed in the transition area T1. For example, when the fastening structure is a physical fastening structure, it can be disposed in the transition area T1, that is, the adhesion performance between the organic layer 302 and the second inorganic layer 303 can be enhanced without affecting the encapsulation effect. When the fastening structure is a chemical fastening structure, the organic layer 302 can also be covered on the entire surface, so that the adhesion performance between the organic layer 302 and the second inorganic layer 303 is enhanced. Since additional processes such as etching are not required, the encapsulation effect of the display panel will not be affected.

It can be understood that, a tightening structure is disposed between the organic layer 302 and the second inorganic layer 303 of the display panel packaging structure, and the tightening structure is at least located in the transition area T1 of the first blocking structure D1. Therefore, the organic layer 302 and the second inorganic layer 303 in the transition area T1 are adhered more tightly through the tightening structure, so as to prevent cracking between the organic film 302 and the inorganic film 303 on the first blocking structure D1 due to the addition of compressive stress layer.

the tightening structure comprises at least one recess 401 disposed on the organic layer 302, the second inorganic layer 303 faces toward a side of the organic layer 302 and a protrusion 402 is disposed at a position corresponding to the recess 401, and the protrusion 402 are matched with the recess 401.

In particular, in order to make the adhesion between the organic layer 302 and the second inorganic layer 303 more closely, it can be achieved by increasing the contact area between the two. For example, multiple recesses 401 are disposed on the organic layer 302. The protrusion 402 is disposed at a side of the organic layer 302 which the second inorganic layer 303 faces toward and is disposed at a position corresponding to the recess 401. The number of the recess 401 and the protrusion 402 can be the same.

In particular, the recess 401 comprises, but is not limited to, a groove 4011 or a blind hole. The cross-sectional shape of the recess 401 is not limited, and it can be tapered, rectangular, stepped, or a structure capable of increasing the contact area between the organic layer 302 and the second inorganic layer 303. Therefore, the structures capable of increasing the adhesion between the organic layer 302 and the second inorganic layer 303 are all within the protection scope of the present application.

In particular, the transition area T1 is a high-incidence region where cracks are generated between the organic layer 302 and the second inorganic layer 303, and the recess 401 is at least disposed in the transition area T1. Of course, the recess 401 can also be disposed in the transition area. However, too many recesses 401 on the layer may affect the encapsulation effect of the display panel. Therefore, the position and arrangement density of the recesses 401 can be adjusted according to actual production requirements.

In particular, the number of the recesses 401 is at least one, specifically two, three, or four lamps, which can be set according to actual production needs. Providing a plurality of recesses 401 can better improve the adhesion performance between the organic layer 302 and the second inorganic layer 303.

It can be understood that, the recesses 401 and the protrusions 402 are disposed between the organic layer 302 and the second inorganic layer 303 of the display panel packaging structure, the recesses 401 are disposed on the organic layer 302 and can be formed by etching, and the recesses 401 are located at least in the transition area T1. The organic layer 302 and the second inorganic layer 303 in the transition region T1 are more closely adhered through the cooperative arrangement of the recesses 401 and the protrusions 402, so as to prevent cracking between the organic film 302 and the inorganic film 303 on the first blocking structure D1 due to the addition of compressive stress layer.

Figure 4:
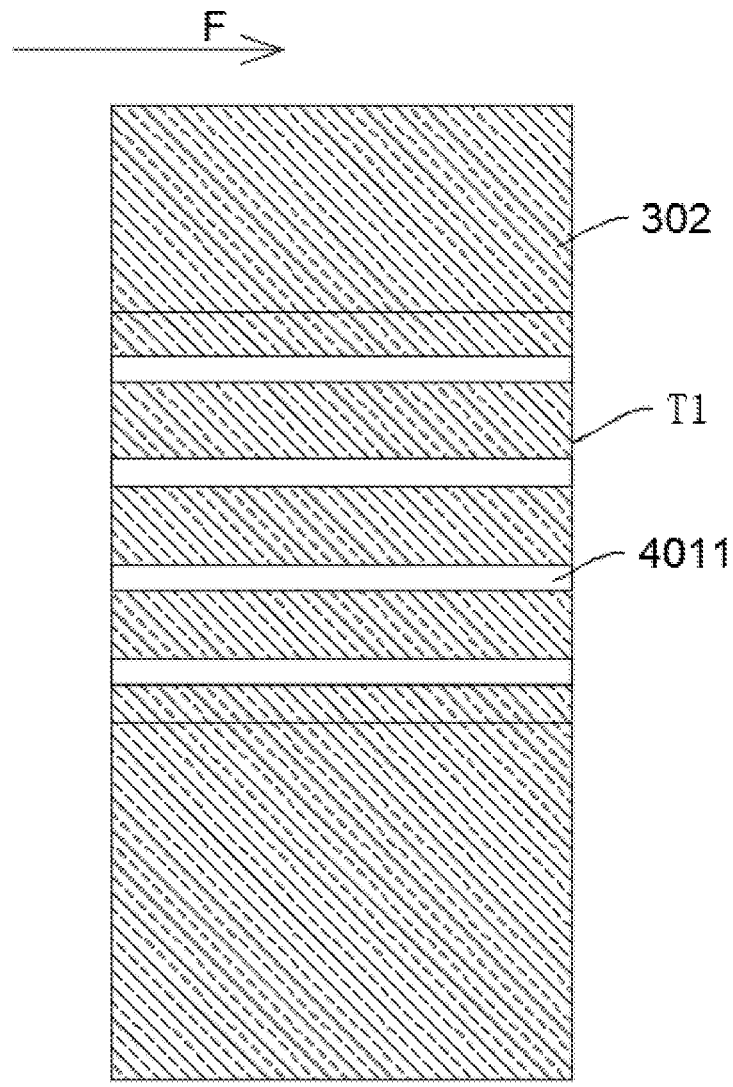
FIG. 4 is a schematic structural diagram of an organic layer in a transition area of a display panel provided by an embodiment of the present application.
Figure 7:
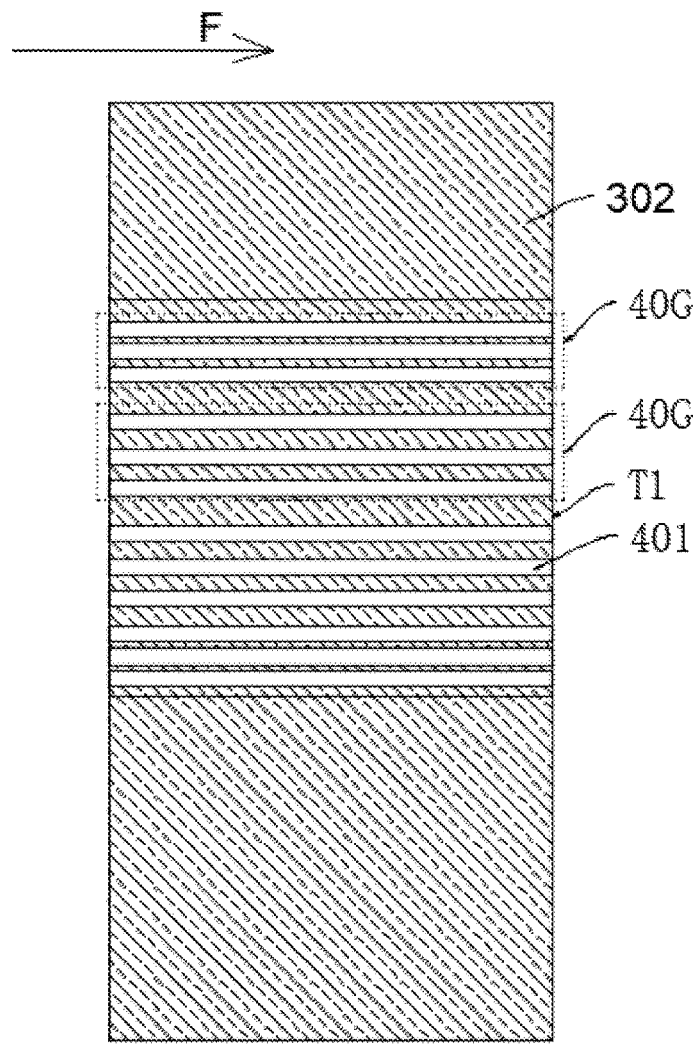
FIG. 7 is a schematic structural diagram of another organic layer in a transition area of a display panel provided by an embodiment of the present application.

In one embodiment, as shown in FIG. 4 and FIG. 7, at least one of the recesses 401 comprises a plurality of grooves 4011, and the second inorganic layer 303 faces a side of the organic layer 302 and a protruding strip is disposed at a position corresponding to the groove 4011, and the protruding strip is disposed in the groove 4011.

In particular, the extending direction of the first blocking structure is F.

In particular, the shape (length direction) of the groove 4011 is not limited to a straight line, and can also be any one of a broken line, a curved line, or a wavy line.

In particular, the plurality of grooves 4011 may be disposed in parallel with each other as shown in FIG. 4 and FIG. 7, or may not be disposed in parallel, which is not specifically limited.

In particular, the depth direction of the groove 4011 may be perpendicular to the transition surface P2, and may also be perpendicular to the base, preferably perpendicular to the base.

In particular, the depths of the plurality of grooves 4011 may be the same or different, and preferably, the plurality of grooves 4011 have the same depth.

In particular, the groove 4011 may be similar to the first blocking structure D1 as a whole. In one example, the groove 4011 is a continuous ring and surrounds the display area AA. In another example, the grooves 4011 can also be a plurality of intermittent short grooves 4011, and the plurality of short grooves 4011 are disposed surrounding the display area AA.

It can be understood that, the grooves 4011 and protruding strips are disposed between the organic layer 302 and the second inorganic layer 303 of the display panel packaging structure, the grooves 4011 are disposed on the organic layer 302 and can be formed by etching, and the grooves 4011 are located at least in the transition area T1. The organic layer 302 and the second inorganic layer 303 in the transition region T1 are more closely adhered through the cooperative arrangement of the grooves 4011 and the protruding strips, so as to prevent cracking between the organic film 302 and the inorganic film 303 on the first blocking structure D1 due to the addition of compressive stress layer.

In one embodiment, the groove 4011 is disposed surrounding the first blocking structure D1, and its extending direction is the same as that of arrow F.

In particular, the groove 4011 is preferably disposed in the transition area T1 on a side of the first blocking structure D1 away from the display area AA.

In particular, the grooves 4011 are disposed on the organic layer 302, and the grooves 4011 are disposed surrounding the first blocking structure D1, that is, the grooves 4011 are disposed surrounding the display area AA. Therefore, after the edge of the display panel is bent, the fixing between the layers of each edge portion is more uniform, and the compressive stress and the stress are reasonably dispersed.

It can be understood that, the grooves 4011 are disposed surrounding the first blocking structure D1 after the edge of the display panel is bent, the fixing between the layers of each edge portion is more uniform, and the compressive stress and the stress are reasonably dispersed.

Figure 5:
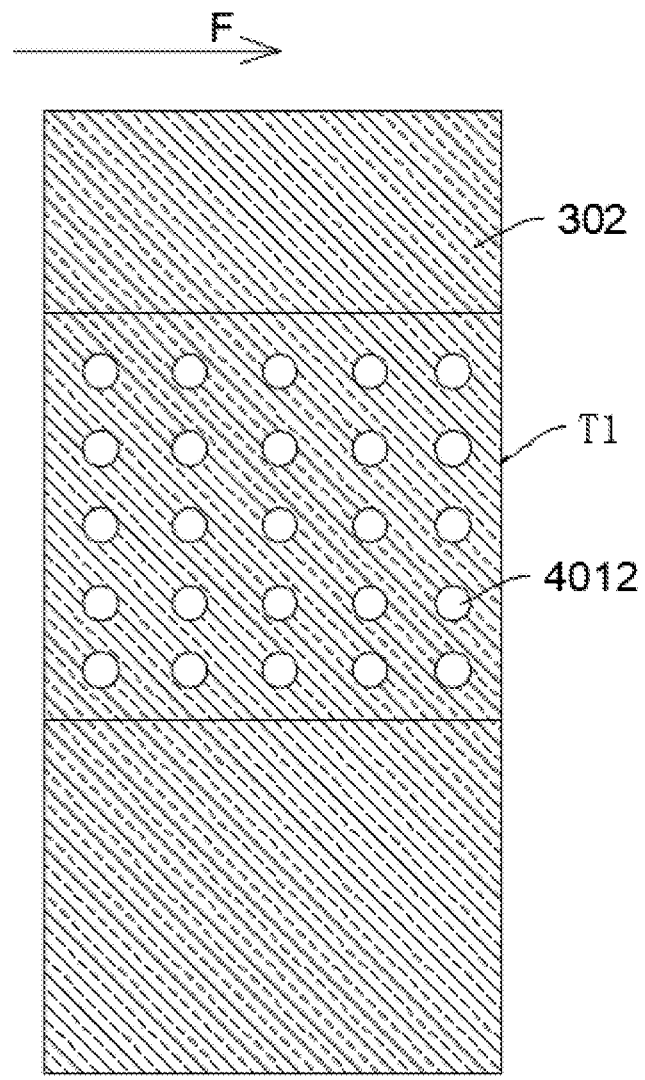
FIG. 5 is a schematic structural diagram of another organic layer in a transition area of a display panel provided by an embodiment of the present application.
Figure 6:
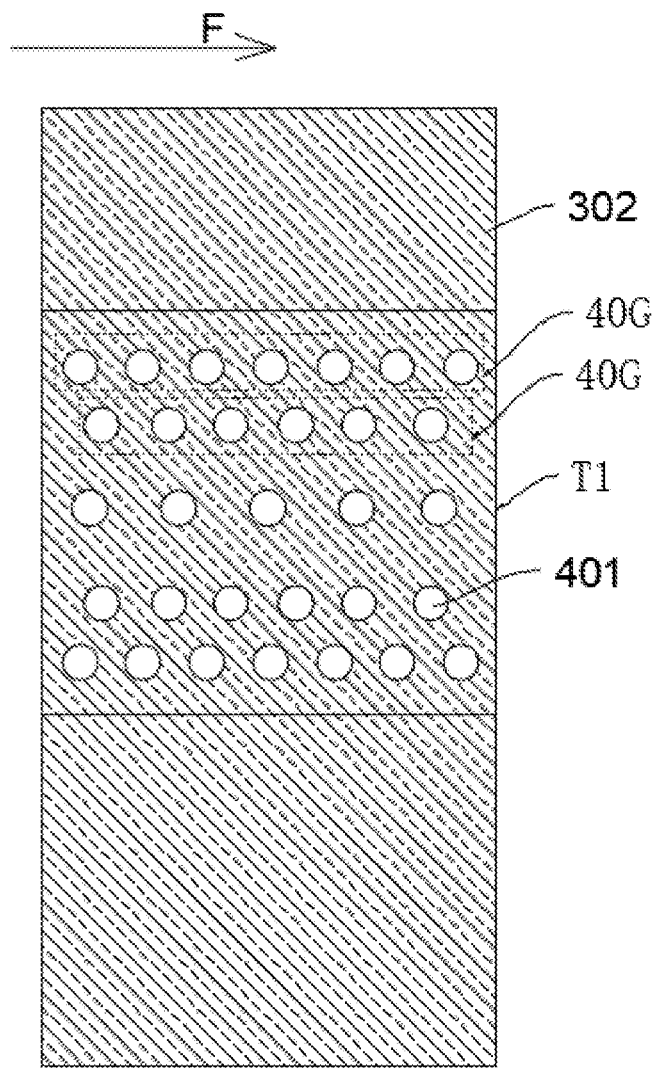
FIG. 6 is a schematic structural diagram of another organic layer in a transition area of a display panel provided by an embodiment of the present application.

In one embodiment, as shown in FIG. 5 and FIG. 6, at least one of the recesses 401 comprises a plurality of fixing holes 4012 disposed at intervals, the second inorganic layer 303 faces a side of the organic layer 302 and a fixing column is provided at a position corresponding to the fixing hole, and the fixing column is disposed in the fixing hole 4012.

In particular, the extending direction of the first blocking structure is the arrow F.

In particular, the number of the fixing holes 4012 is the same as the number of the fixing posts, and the positions are matched.

In particular, the recess 401 comprises a plurality of fixing holes 4012 disposed at intervals, and the depth direction of the fixing holes 4012 may be perpendicular to the transition surface P2 or perpendicular to the base, preferably perpendicular to the base.

In particular, the depths of the plurality of fixing holes 4012 may be the same or different. Preferably, the plurality of fixing holes 4012 have the same depth. Preferably, the depth of the fixing holes 4012 is smaller than the thickness of the organic layer 302.

In particular, a plurality of the fixing holes 4012 are uniformly distributed on the organic layer 302 in the transition area T1. In an example, the plurality of the fixing holes 4012 may be disposed surrounding the display area AA.

In particular, the shape of the cross-section of the fixing hole 4012 is not limited, and may be any one of a cone, a square or a trapezoid, and the projection of the fixing hole 4012 on the transition surface P2 may be a circle or an ellipse or square, there is no specific limitation, and can be adjusted according to actual production needs.

In particular, the spacing distances between the plurality of fixing holes 4012 are also not shown. Preferably, the spacing distances between adjacent fixing holes 4012 are equal.

It can be understood that, the fixing holes 4012 and fixing columns are disposed between the organic layer 302 and the second inorganic layer 303 of the display panel packaging structure, the fixing holes 4012 are disposed on the organic layer 302 and can be formed by etching, and the fixing holes 4012 are located at least in the transition area T1. The organic layer 302 and the second inorganic layer 303 in the transition area T1 are more closely adhered through the matching arrangement of the fixing holes 4012 and the fixing columns, so as to prevent cracking between the organic film 302 and the inorganic film 303 on the first blocking structure D1 due to the addition of compressive stress layer.

In one embodiment, as shown in FIG. 6 and FIG. 7, at least one of the recesses 401 comprises a plurality of fastening structure groups 40G, one of the fastening structure groups 40G comprises a plurality of recesses 401, and a plurality of the fastening structure groups 40G are disposed in sequence along a direction from the display area AA to the non-display area VA;

wherein, in any two of the fastening structure groups 40G, the distribution density of the recesses 401 in one of the fastening structure groups 40G close to the top surface P1 or the substrate 10 is greater than the distribution density of the recesses 401 in the other one of the fastening structure group 40G far from the top surface P1 or the substrate 10.

In particular, the extending direction of the first blocking structure is the arrow F.

In particular, as shown in FIG. 3, the organic layer 302 has an inclined surface corresponding to the transition surface P2, an upper top surface P3 corresponding to the top surface P1, and a lower bottom surface P4 corresponding to the substrate. The higher side of the inclined surface is connected to the upper top surface P3, and the bottom side is connected to the lower bottom surface P4.

It should be noted that, in the transition area T1, the organic layer 302 corresponds to the inclined surface of the transition surface P2. The closer to the upper top surface P3 or the lower bottom surface P4, the greater the combined force of the compressive stress and the stress received between the organic layer 302 and the second inorganic layer 303, and the easier it is to produce cracks between the layers. In order to further solve the above problem, the grooves 4011 and the protrusions 402 in this embodiment are structurally disposed as follows.

In particular, according to the difference in the combined force received at different positions between the organic layer 302 and the second inorganic layer 303, in this embodiment, recesses 401 with different arrangement densities are set for different regions. In the case of force, the recesses 401 are relatively more densely disposed in the area with greater force, and the recesses 401 are disposed sparsely in the area with less force.

In particular, as shown in FIGS. 6 and 7, the organic layer 302 is provided with a plurality of fastening structure groups 302, and each fastening structure group 40G is provided with a plurality of recesses 401. As shown in FIG. 6, the recess 401 is a fixing hole 4012, and a plurality of fastening structure groups 40G are disposed in sequence along an extending direction perpendicular to the blocking structure. Among any two fastening structure groups 40G, one of the fastening structure groups 40G has a shortest distance from the upper top surface P3 or the lower bottom surface P4, the one of the fastening structure groups 40G has a shortest distance from the upper top surface P3 or the lower bottom surface P4. Among the two shortest distances, the density of the fixing holes 4012 in one fastening structure group 40G with the larger distance is smaller than the density of the fixing holes 4012 in the other fastening structure group 40G with the smaller distance. In FIG. 7, there is the vertical spacing between the three grooves 4011 (recesses 401).

In particular, the spacing distance between any two adjacent recesses 401 in the same fastening structure group 40G is the same.

It can be understood that the recesses 401 with different arrangement densities are set for different areas. According to the actual stress situation, the recesses 401 are relatively densely disposed in the area with greater force, and the recesses 401 are relatively sparsely disposed in the area with smaller force. The above technical solution can make the fastening effect of the fastening structure better, and the adhesion performance between the organic layer 302 and the second inorganic layer 303 is stronger.

In one embodiment, as shown in FIG. 3, the depth direction of the recess 401 is perpendicular to the substrate 10.

In particular, the recess 401 is formed by etching. Therefore, the depth direction of the recess 401 is perpendicular to the inclined surface of the organic layer 302, and the depth direction of the recess 401 is perpendicular to the substrate 10. It greatly facilitates the production of the display panel.

Figure 9:
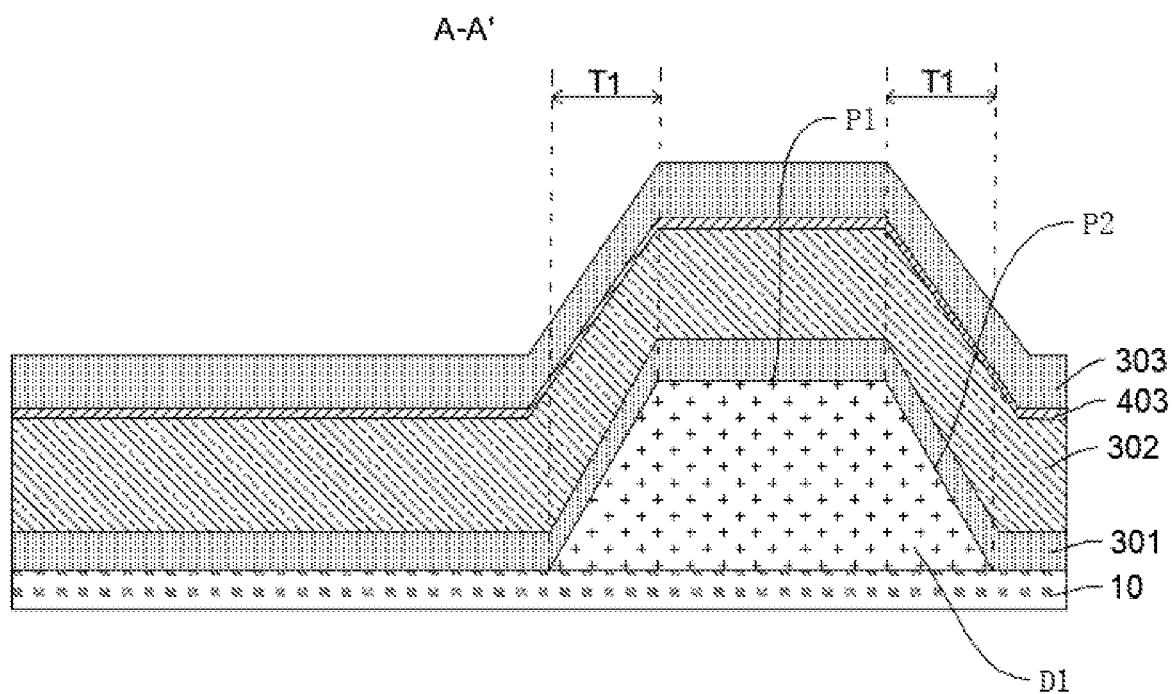
FIG. 9 is a schematic partial cross-sectional structure diagram of another A-A' in FIG. 1.

In one embodiment, as shown in FIG. 9, the tightening structure comprises an adhesive layer 403, the adhesive layer 403 at least covers the organic layer 302 in the transition area T1, and the material of the adhesive layer 403 comprises hydrogen-doped amorphous silicon.

In particular, the adhesive layer 403 can cover the entire surface of the organic layer 302, and the thickness of the adhesive layer 403 is not limited, and can be adjusted according to actual production conditions. The thickness capable of improving the adhesion performance between the organic layer 302 and the second inorganic layer 303 is within the protection scope of the present application.

In particular, the material of the adhesive layer 403 comprises hydrogen-doped amorphous silicon, and the hydrogen-doped amorphous silicon contains a large amount of hydrogen atoms, which can increase the number of chemical bonds between the organic layer 302 and the second inorganic layer 303. Therefore, the interface bonding energy between the organic layer 302 and the second inorganic layer 303 is improved, and the probability of cracks occurring between the organic layer 302 and the second inorganic layer 303 is reduced.

It can be understood that, the adhesive layer 403 is disposed between the organic layer 302 and the second inorganic layer 303 of the display panel packaging structure, and the material of the adhesive layer 403 comprises hydrogen-doped amorphous silicon. The organic layer 302 and the second inorganic layer 303 are more closely adhered through increasing the chemical bond between the layers, so as to prevent cracking between the organic film 302 and the inorganic film 303 on the first blocking structure D1 due to the addition of compressive stress layer.

Figure 8:
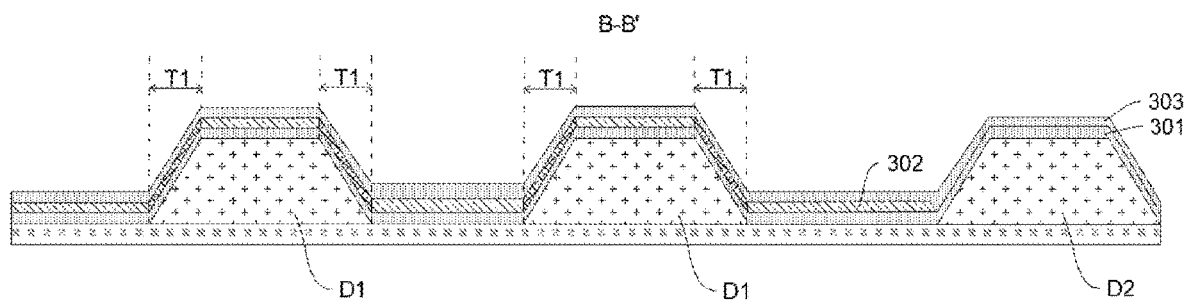
FIG. 8 is the partial cross-sectional structure schematic diagram of B-B' of FIG. 1.

In one embodiment, as shown in FIG. 1 and FIG. 8, the display panel comprises a second blocking structure D2, and the second blocking structure D2 is located on a side of the first blocking structure D1 away from the display area AA, and the second blocking structure D2 is disposed surrounding the first blocking structure D1, and the organic layer 302 is located in the area surrounded by the second blocking structure D2.

In particular, the second blocking structure D2 may be the same as the first blocking structure D1, the height of the second blocking structure D2 may also be greater than the height of the first blocking structure D1, and the organic layer 302 is located in the area surrounded by the second blocking structure D2. On the second blocking structure D2 and on the outside of the second blocking structure D2, the first inorganic layer 301 is in direct contact with the second inorganic layer 303, and the interfacial bonding ability between the layers is improved. Therefore, the encapsulation layer 30 composed of the first inorganic layer 301, the organic layer 302, the second inorganic layer 303, the first blocking structure D1 and the second blocking structure D2 has better encapsulation effect and can effectively prevent external oxygen and water molecules from corroding the display device.

It can be understood that, the second blocking structure D2 is disposed on the periphery of the first blocking structure D1, and the organic layer 302 is disposed in the area surrounded by the second blocking structure D2, the encapsulation layer 30 of the display panel is close to the area surrounded by the second blocking structure D2. Therefore, part of the first inorganic layer 301 at the edge is in direct contact with the second inorganic layer 303, and the interface bonding ability between the layers is improved, so that the encapsulation layer 30 formed by the first inorganic layer 301, the organic layer 302, the second inorganic layer 303, the first blocking structure D1 and the second blocking structure D2 has better encapsulation effect, so as to effectively prevent the external oxygen and water molecules from corroding the display device and improve the service life of the display panel.

In addition, an embodiment of the present application further provides a mobile terminal, including the display panel described in any one of the above and a terminal body, wherein the terminal body and the display panel are assembled together.

In particular, the mobile terminals comprise but are not limited to the following types: rollable or foldable mobile phones, watches, wristbands, TVs or other wearable display or touch electronic devices, as well as flexible smart phones, tablet computers, notebooks computers, desktop monitors, TV sets, smart glasses, smart watches, ATM machines, digital cameras, automotive monitors, medical displays, industrial control displays, electronic paper books, electrophoretic display equipment, game consoles, transparent displays, double-sided displays, naked eye 3D displays, mirror display devices, transflective display devices, etc.

To sum up, the present application provides a tightening structure between the organic layer 302 and the second inorganic layer 303 of the display panel packaging structure, and the tightening structure is at least located in the transition area T1 of the first blocking structure D1. The organic layer 302 and the second inorganic layer 303 in the transition area T1 are adhered more tightly through the fastening structure, so as to prevent cracks from occurring between the organic layer 302 and the second inorganic layer 303 on the first barrier structure D1 due to the addition of the compressive stress layer.

A display panel and a mobile terminal provided by the embodiments of the present application have been introduced in detail above. The principles and implementations of the present application are described with specific examples in this document. The descriptions of the above embodiments are only used to help understand the present application. At the same time, for those skilled in the art, according to the concept of this application, there will be changes in the specific implementation and application scope. In summary, the content of this specification should not be construed as a application restrictions.

What is claimed is:

1. A display panel, comprising:
  a substrate, wherein the substrate comprises a display area and a non-display area surrounding the display area;
  a display function layer, wherein the display function layer is disposed on the substrate in the display area;
  a first blocking structure, wherein the first blocking structure is disposed on the substrate in the non-display area, and the first blocking structure is disposed surrounding the display area, the first blocking structure comprises a top surface parallel to the substrate and a transition surface connecting the top surface and the substrate, the first blocking structure comprises a transition area, and the transition surface is located in the transition area;

a first inorganic layer, wherein the first inorganic layer is disposed on the substrate, the first blocking structure and the display function layer;

an organic layer, wherein the organic layer is disposed on the first inorganic layer, and covers the display function layer, the first blocking structure and part of the first inorganic layer; and a second inorganic layer, wherein the second inorganic layer is disposed on the organic layer, and covers the display function layer, the first blocking structure and the organic layer;

wherein a tightening structure is disposed between the organic layer and the second inorganic layer, the tightening structure is at least located in the transition area and comprises a plurality of recesses disposed on the organic layer, the second inorganic layer faces toward a side of the organic layer and is provided with a plurality of protrusions at a position corresponding to the recesses, and the protrusions are matched with the recesses, and the plurality of recesses comprise a plurality of fastening structure groups, and the fastening structure groups are disposed in sequence along a direction from the display area to the non-display area;

wherein, among any two of the fastening structure groups, a distribution density of the recesses in one of the fastening structure groups close to the top surface or the substrate is greater than a distribution density of the recesses in another one of the fastening structure groups away from the top surface or the substrate.

2. The display panel according to claim 1, wherein the at least one plurality of recesses comprises a plurality of grooves, the second inorganic layer faces toward a side of the organic layer and is provided with a plurality of protruding strips at positions corresponding to the grooves, and the protruding strips are disposed in the grooves.

3. The display panel according to claim 2, wherein the grooves are disposed surrounding the first blocking structure.

4. The display panel according to claim 1, wherein the plurality of recesses comprises a plurality of fixing holes disposed at intervals, the second inorganic layer faces toward a side of the organic layer and is provided with a plurality of fixing columns at positions corresponding to the fixing holes, and the fixing columns are disposed in the fixing holes.

5. The display panel according to claim 1, wherein a depth direction of the recesses is perpendicular to the substrate.

6. The display panel according to claim 1, wherein the tightening structure comprises an adhesive layer, the adhesive layer at least covers the organic film in the transition area, and a material of the adhesive layer comprises hydrogen-doped amorphous silicon.

7. The display panel according to claim 1, wherein the display panel comprises a second blocking structure, the second blocking structure is located at a side of the first blocking structure away from the display area, the second blocking structure is disposed surrounding the first blocking structure, and the organic layer is located in a region surrounded by the second blocking structure.

8. The display panel according to claim 1, wherein a material of the first inorganic layer and the second inorganic layer comprises silicon nitride, silicon oxide, and aluminum oxide and a material of the organic layer comprises acrylate.

9. A mobile terminal, wherein the mobile terminal comprises a display panel and a terminal body, and the terminal body and the display panel are assembled together, wherein the display panel comprises:

a substrate, wherein the substrate comprises a display area and a non-display area surrounding the display area;

a display function layer, wherein the display function layer is disposed on the substrate in the display area;

a first blocking structure, wherein the first blocking structure is disposed on the substrate in the non-display area, and the first blocking structure is disposed surrounding the display area, the first blocking structure comprises a top surface parallel to the substrate and a transition surface connecting the top surface and the substrate, the first blocking structure comprises a transition area, and the transition surface is located in the transition area;

a first inorganic layer, wherein the first inorganic layer is disposed on the substrate, the first blocking structure and the display function layer;

an organic layer, wherein the organic layer is disposed on the first inorganic layer, and covers the display function layer, the first blocking structure and part of the first inorganic layer; and a second inorganic layer, wherein the second inorganic layer is disposed on the organic layer, and covers the display function layer, the first blocking structure and the organic layer;

wherein a tightening structure is disposed between the organic layer and the second inorganic layer, the tightening structure is at least located in the transition area and comprises a plurality of recesses disposed on the organic layer, the second inorganic layer faces toward a side of the organic layer and is provided with a plurality of protrusions at a position corresponding to the recesses, and the protrusions are matched with the recesses, and the plurality of recesses comprise a plurality of fastening structure groups, and the fastening structure groups are disposed in sequence along a direction from the display area to the non-display area;

wherein, among any two of the fastening structure groups, a distribution density of the recesses in one of the fastening structure groups close to the top surface or the substrate is greater than a distribution density of the recesses in another one of the fastening structure groups away from the top surface or the substrate.

10. The mobile terminal according to claim 9, wherein the plurality of recesses comprises a plurality of grooves, the second inorganic layer faces toward a side of the organic layer and is provided with a plurality of protruding strips at positions corresponding to the grooves, and the protruding strips are disposed in the grooves.

11. The mobile terminal according to claim 10, wherein the grooves are disposed surrounding the first blocking structure.

12. The mobile terminal according to claim 9, wherein the plurality of recesses comprises a plurality of fixing holes disposed at intervals, the second inorganic layer faces toward a side of the organic layer and is provided with a fixing column at positions corresponding to the fixing holes, and the fixing columns are disposed in the fixing holes.

13. The mobile terminal according to claim 9, wherein a depth direction of the recesses is perpendicular to the substrate.

14. The mobile terminal according to claim 9, wherein the tightening structure comprises an adhesive layer, the adhesive layer at least covers the organic film in the transition area, and a material of the adhesive layer comprises hydrogen-doped amorphous silicon.

15. The mobile terminal according to claim 9, wherein the display panel comprises a second blocking structure, the second blocking structure is located at a side of the first blocking structure away from the display area, the second blocking structure is disposed surrounding the first blocking structure, and the organic layer is located in a region surrounded by the second blocking structure.

16. The mobile terminal according to claim 9, wherein a material of the first inorganic layer and the second inorganic layer comprises silicon nitride, silicon oxide, and aluminum oxide and a material of the organic layer comprises acrylate.

\* \* \* \* \*